United States Patent [19]

Martinez, Jr.

[11] Patent Number: 5,742,184
[45] Date of Patent: Apr. 21, 1998

[54] MICROPROCESSOR HAVING A COMPENSATED INPUT BUFFER CIRCUIT

[75] Inventor: Marvin W. Martinez, Jr., Plano, Tex.

[73] Assignee: Cyrix Corporation, Richardson, Tex.

[21] Appl. No.: 603,053

[22] Filed: Feb. 16, 1996

[51] Int. Cl.[6] .................. H03K 19/0185; H03K 19/0948
[52] U.S. Cl. ..................... 326/83; 326/34; 326/50; 326/68
[58] Field of Search ................ 326/83, 86, 49–50, 326/31, 34, 81, 68, 70–71

[56] References Cited

U.S. PATENT DOCUMENTS

| 4,908,528 | 3/1990 | Huang | 326/83 |
|---|---|---|---|
| 5,220,213 | 6/1993 | Woo | 326/87 |
| 5,465,058 | 11/1995 | Krenik et al. | 326/83 |
| 5,477,166 | 12/1995 | Matthews | 326/83 |

Primary Examiner—Jon Santamauro
Attorney, Agent, or Firm—Andrew S. Viger; John L. Maxin

[57] ABSTRACT

An input buffer circuit provides programmable resistors for inputs to a microprocessor and compensates for switching voltage timing differences caused when a selected programmable resistor is utilized for a selected input. In a preferred embodiment, an input buffer circuit has a weak transistor coupled between the input and an operating voltage source or ground, and a compensation circuit including two transistors in series between the operating voltage source or ground, and an output. When the weak transistor is on, thereby raising or lowering the input signal, one of the transistors is also on and the other transistor couples the output to the operating voltage source or ground.

5 Claims, 6 Drawing Sheets

MICROPROCESSOR HAVING A COMPENSATED INPUT BUFFER CIRCUIT

BACKGROUND OF THE INVENTION

The present invention relates generally to microprocessors and, in a preferred embodiment thereof, more particularly provides a microprocessor having a compensated input buffer circuit.

Economical mass production of microprocessors requires that a microprocessor be adaptable for use in different environments. For example, it may currently be desirable for a microprocessor to be adaptable for use in either a Pentium™ or a '486 computing environment. Such adaptation of the microprocessor may be made during production, by software control after the microprocessor has been installed, by hardware (e.g. bond wire connections or switches), or by other methods.

A problem of adapting a microprocessor to different environments has to do with the voltage at which components such as transistors switch. For CMOS-type devices on a microprocessor, switching voltage is determined by the operating voltage, or VDD and P/N ratio. CMOS specifications typically require that a CMOS device switch at one-half the VDD voltage. Thus, a CMOS device running at a VDD of 3.0 volts typically has a switching voltage of 1.5 volts.

A microprocessor having CMOS devices thereon may, however, be installed in a bus which utilizes TTL devices. The switching voltage for most current TTL devices is required to be 1.5 volts, but there is no precise relationship between the switching voltage and the rail voltage of a TTL device. Therefore, although it may be possible for CMOS devices on a microprocessor and a bus utilizing TTL devices to have the same switching voltage and the same rail voltage, it is also quite possible for these voltages to be different.

Resistors have been incorporated at selected inputs on microprocessors and are very well known in the art. For example, it is common practice to insert resistors at unused inputs on a microprocessor. Where a microprocessor is to be utilized in different environments, some manufacturers have incorporated resistors at all inputs that may be unused, and selected certain ones of the resistors when it was known in which particular environment the microprocessor would be utilized. The appropriate resistors were selected and tied to the corresponding microprocessor inputs during manufacture, in effect customizing the microprocessor for that particular environment.

The selectable resistors, however, exacerbate the problem of matching the switching voltage of the TTL devices with the leading and trailing edges of the signal output by the input buffer circuit. Where the signal from the external environment must be pulled up to match the CMOS VDD voltage, the leading edge of the output signal will begin before the input signal has reached its external switching voltage, and the trailing edge of the output signal will begin after the input signal has reached its external switching voltage. The external switching voltage is, thus, effectively lowered in this situation.

Conversely, where the signal from the external environment must be pulled down to match the CMOS device VDD voltage, the leading edge of the output signal will begin after the input signal has reached its external switching voltage, and the trailing edge of the output signal will begin before the input signal has reached its external switching voltage. The external switching voltage is, thus, effectively raised in this situation.

Additionally, there may be factors due to the microprocessor's packaging, such as resistance of conductors and circuitry for protecting against electrostatic discharge on the die, etc., which affect the input signal voltage before it reaches the input buffer circuit. Such changes in the input signal voltage will also affect the switching voltage adversely. The raising or lowering of the input signal voltage caused by the resistors, combined with the other factors influencing the input signal voltage due to the microprocessor packaging, produce very undesirable displacement of the effective external switch point.

As clock speeds continue to increase, the difference between rising skew of the external signal and falling skew of the internal buffered output in microprocessors becomes increasingly important. The placement of selectable resistors in input buffer circuits does not address switching voltage timing, and actually causes an increase in timing differences between switching voltages of external TTL devices and the leading and trailing edges of the signal output to CMOS devices. Thus, selectable resistors alone cannot compensate for switching voltage timing differences.

From the foregoing, it can be seen that it would be quite desirable to provide a microprocessor having an input buffer circuit which compensates for voltage differences and timing differences between the microprocessor and an external environment in which the microprocessor is utilized, for example, so that the leading and trailing edges of the signal output to the microprocessor correspond in time to the occurrence of the switching voltage of the external environment. It is accordingly an object of the present invention to provide such a microprocessor and associated methods of input buffering and compensation.

SUMMARY OF THE INVENTION

In carrying out the principles of the present invention, in accordance with an embodiment thereof, a microprocessor is provided which has an integral compensated input buffer circuit. The input buffer circuit includes programmable resistors for selectively raising or lowering an input signal voltage, and matches the timing of the incoming switching voltage to the timing of the resulting signal output to the microprocessor. Thus, timing differences associated with effectively pulled up or pulled down switching voltages are not experienced with microprocessors embodying principles of the present invention.

In broad terms, an input buffer circuit is provided which includes input and output signal lines, and a voltage source line. The input signal line is capable of conducting an input signal, the output signal line is capable of conducting an output signal, and the voltage source line is capable of coupling to a voltage source.

The circuit also includes a weak transistor and first, second, third, and fourth transistors. The weak transistor has an input and is coupled intermediate the voltage source line and the input signal line. The first and second transistors each have an input and a size, and are connected in series. The first transistor input is coupled to the input signal line, and the second transistor input is coupled to the first weak transistor input.

The third transistor is connected in series with the first and second transistors intermediate the voltage source line and the first and second transistors. The fourth transistor is connected in parallel with the first and second transistors intermediate the third transistor and the output signal line and has an input coupled to the input signal line.

Also provided is an input buffer circuit having an input signal line, an output signal line, a ground line, and first, second, and third coupling means. The first coupling means selectively couples the input signal line to the ground line through a resistance to thereby lower a voltage level of the input signal line. The second coupling means selectively couples the ground line to the output signal line in response to the voltage level of the input signal line. The third coupling means couples the ground line to the output signal line in response to the voltage level of the input signal line.

A processor for use within a computing system having an input signal line capable of conducting an input signal, a ground line couplable to a ground, and a voltage source line couplable to a voltage source, is provided as well. The processor comprises an output signal line, a weak transistor, and first, second, third, and fourth transistors. The weak transistor is couplable intermediate the voltage source line and the input signal line.

The first and second transistors are connected in series, and each of the first and second transistors has an input and a size. The first transistor input is couplable to the input signal line, and the second transistor input is coupled to the first weak transistor input. The third gate is connected in series with the first and second transistors intermediate the voltage source line and the first and second transistors. The fourth transistor is connected in parallel with the first and second transistors intermediate the third transistor and the output signal line. The fourth transistor has an input couplable to the input signal line.

Additionally, a computing system including an operating voltage source, a first device capable of transmitting a signal on an input line, a ground, and a processor is provided by the present invention. The processor has a second device coupled to the operating voltage source and an input buffer circuit.

The input buffer circuit is coupled to the input line and includes an output line coupled to the second device, a programmable resistor coupled intermediate the input line and the operating voltage source, and first, second, and third transistors. The first transistor is coupled intermediate the operating voltage source and the output line, and the first transistor input is coupled to the input line. The second transistor is coupled intermediate the operating voltage source and the first transistor, and the second transistor input is coupled to the first programmable resistor input. The third transistor is coupled intermediate the operating voltage source and the output line, and the third transistor input is coupled to the input line.

A method of buffering a signal input to a processor incorporating a device having an operating voltage is also provided, which method includes the steps of providing an output to the processor, a programmable resistor having an input, and first, second, and third transistors. The first programmable resistor is coupled intermediate the signal and the device operating voltage. The first transistor is coupled intermediate the device operating voltage and the output, and the first transistor input is coupled to the signal.

The second transistor is coupled intermediate the device operating voltage and the first transistor, and the second transistor input is coupled to the first programmable resistor input. The third transistor is coupled intermediate the device operating voltage and the output, and the third transistor input is coupled to the signal.

Another method is provided by the present invention of buffering a signal input to a microprocessor, wherein the signal has a rail voltage and a switch point, and the microprocessor incorporates a device having an operating voltage source and a ground. The method includes the steps of providing a plurality of p-channel transistors, each of the p-channel transistors having an input, and a first one of the p-channel transistors is implemented as a programmable resistor, coupling second and third ones of the p-channel transistors in series intermediate the device operating voltage source and the device, coupling the second p-channel transistor input to the signal, coupling the third p-channel transistor input to the first programmable resistor input, coupling a fourth one of the p-channel transistors intermediate the device operating voltage source and the device in parallel with the second and third p-channel transistors, coupling the fourth p-channel transistor input to the signal, and coupling a fifth one of the p-channel transistors in series intermediate the device operating voltage and the third and fourth p-channel transistors.

Furthermore, a method of aligning falling and rising edges of an output signal coupled to a device having an operating voltage and a ground, with a switching voltage of an input signal from a selected one of a plurality of computing environments is provided. The method comprises the steps of providing a plurality of transistors and a plurality of disconnectable connections. Each of the connections is associated with a corresponding one of the transistors. Each of the transistors is interconnected with a corresponding one of the connections intermediate the device operating voltage and the output signal in parallel with the others of the transistors and the corresponding ones of the connections. Each of the transistor inputs is coupled to the input signal, and selected ones of the connections are connected, in order to selectively couple corresponding selected ones of the transistors to the output signal.

The use of the disclosed microprocessor, and associated methods of buffering and compensating input to the microprocessor, enables economical mass production of microprocessors adaptable for use in a variety of environments. The microprocessor may, during or after production thereof, be adapted for use in a particular environment by connecting a combination of transistors which permit the leading and trailing edges of the signal output to the microprocessor to coincide in time with the switching voltage of the input signal.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

The detailed description of an exemplary embodiment of the microprocessor of the present invention is organized as follows:

1. Exemplary Processor System
    1.1. Microprocessor
    1.2. System
2. Generalized Pipeline Architecture
3. Input Buffer Circuit This organizational table, and the corresponding headings used in this detailed description, are provided for the convenience of reference only. Detailed description of conventional or known aspects of the microprocessor are omitted as to not obscure the description of the invention with unnecessary detail.

1. Exemplary Processor System

Figure 1A:
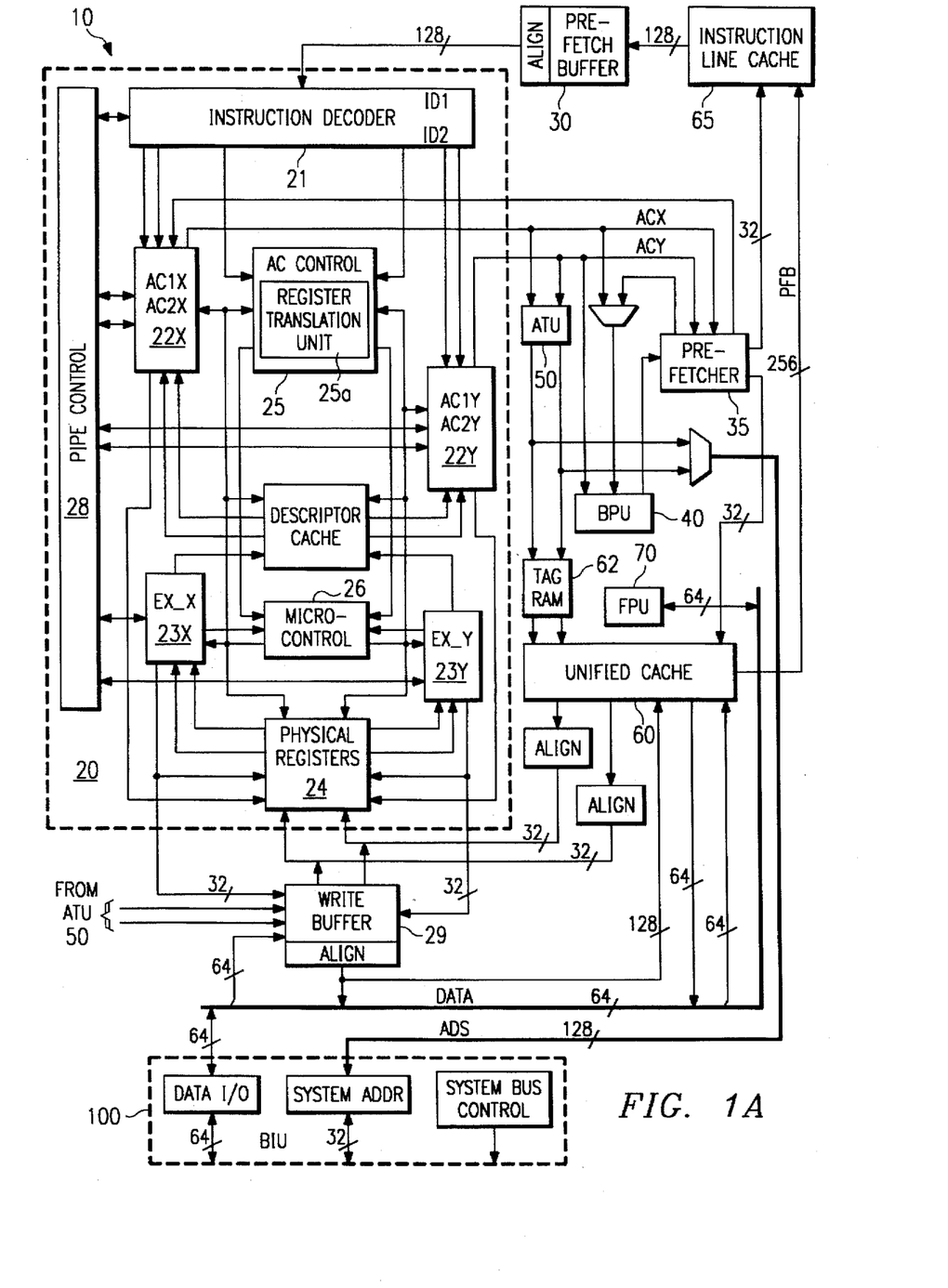
FIG. 1A illustrates a block diagram of the overall microprocessor.
Figure 1B:
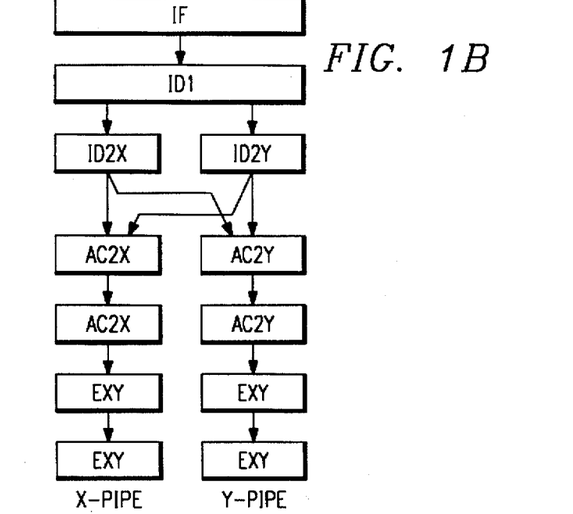
FIG. 1B illustrates a generalized block diagram of the instruction pipeline stages.
Figure 2:
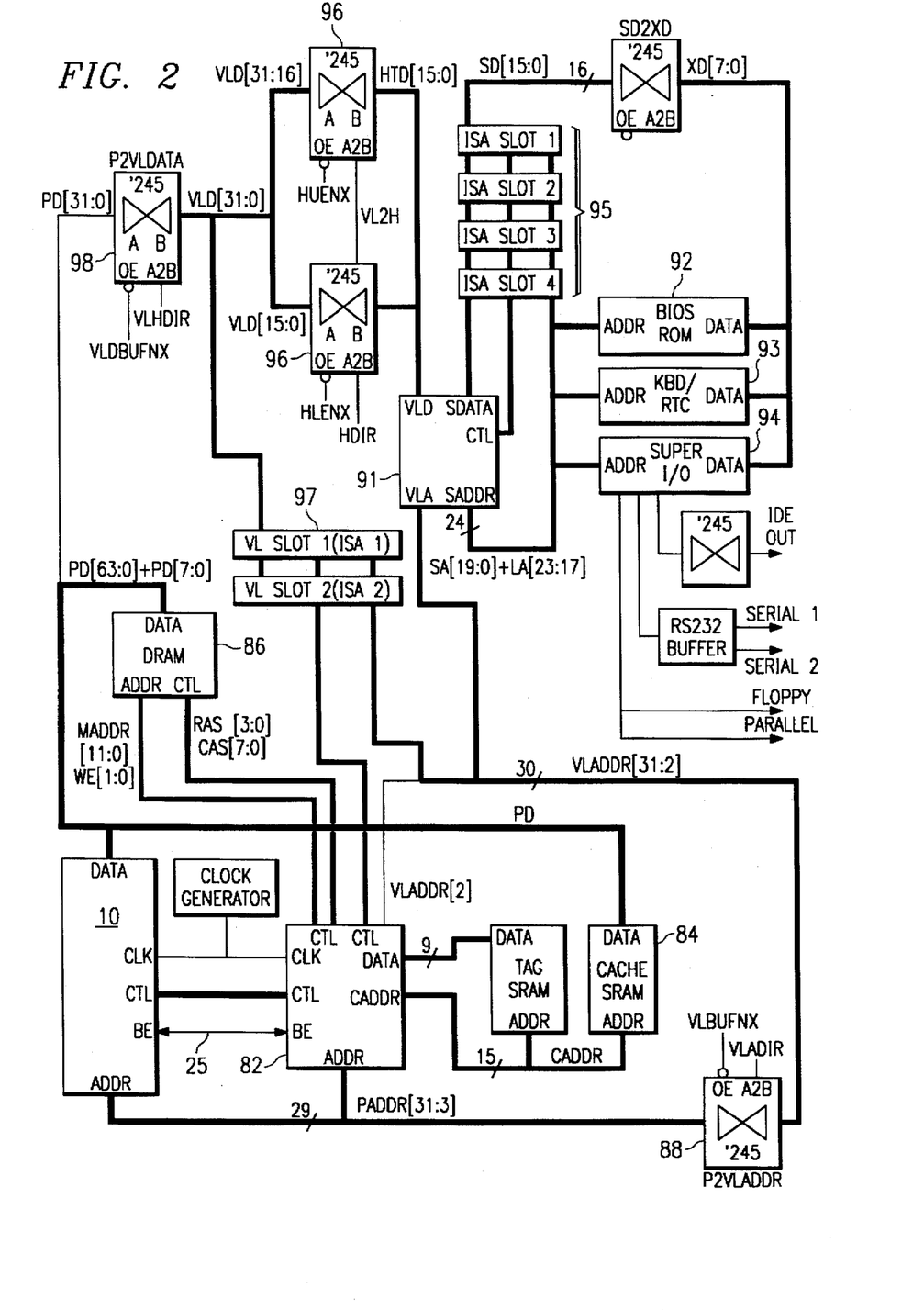
FIG. 2 illustrates a block diagram of a processor system using the microprocessor.

The exemplary processor system is shown in FIGS. 1A, 1B, and 2. FIGS. 1A and 1B respectively illustrate the basic functional blocks of the exemplary superscalar, superpipelined microprocessor along with the pipe stages of the two execution pipelines. FIG. 2 illustrates an exemplary processor system (motherboard) design using the microprocessor.

1.1. Microprocessor

Referring to FIG. 1A, the major sub-blocks of a microprocessor 10 include:

(a) central processing unit (CPU) core 20;

(b) prefetch buffer 30;

(c) prefetcher 35;

(d) branch processing unit (BPU) 40;

(e) address translation unit (ATU) 50; and (f) unified 16 Kbyte code/data cache 60, including TAG RAM 62.

A 256 byte instruction line cache 65 provides a primary instruction cache to reduce instruction fetches to the unified cache, which operates as a secondary instruction cache. An onboard floating point unit (FPU) 70 executes floating point instructions issued to it by the CPU core 20.

The microprocessor uses internal 32-bit address and 64-bit data buses ADS and DATA, respectively. A 256 bit (32 byte) prefetch bus (PFB), corresponding to the 32 byte line size of the unified cache 60 and the instruction line cache 65, allows a full line of 32 instruction bytes to be transferred to the instruction line cache in a single clock. Interface to external 32 bit address and 64 bit data buses is through a bus interface unit (BIU).

The CPU core 20 is a superscalar design with two execution pipes X and Y. It includes an instruction decoder 21, address calculation units 22X and 22Y, execution units 23X and 23Y, and a register file 24 with 32 32-bit registers. An AC control unit 25 includes a register translation unit 25a with a register scoreboard and register renaming hardware. A microcontrol unit 26, including a microsequencer and microROM, provides execution control.

Writes from CPU core 20 are queued into twelve 32 bit write buffers 29—write buffer allocation is performed by the AC control unit 25. These write buffers provide an interface for writes to the unified cache 60—noncacheable writes go directly from the write buffers to external memory. The write buffer logic supports optional read sourcing and write gathering.

A pipe control unit 28 controls instruction flow through the execution pipes, including: keeping the instructions in order until it is determined that an instruction will not cause an exception; squashing bubbles in the instruction stream; and flushing the execution pipes behind branches that are mispredicted and instructions that cause an exception. For each stage, the pipe control unit keeps track of which execution pipe contains the earliest instruction, provides a "stall" output, and receives a "delay" input.

BPU 40 predicts the direction of branches (taken or not taken), and provides target addresses for predicted taken branches and unconditional change of flow instructions (jumps, calls, returns). In addition, it monitors speculative execution in the case of branches and floating point instructions, i.e., the execution of instructions speculatively issued after branches which may turn out to be mispredicted, and floating point instructions issued to the FPU which may fault after the speculatively issued instructions have completed execution. If a floating point instruction faults, or if a branch is mispredicted (will not be known until the EX or WB stage for the branch), then the execution pipeline must be repaired to the point of the faulting or mispredicted instruction (i.e., the execution pipeline is flushed behind that instruction), and instruction fetch restarted.

Pipeline repair is accomplished by creating checkpoints of the processor state at each pipe stage as a floating point or predicted branch instruction enters that stage. For these checkpointed instructions, all resources (programmer visible registers, instruction pointer, conditional code register) that can be modified by succeeding speculatively issued instructions are checkpointed. If a checkpointed floating point instruction faults or a checkpointed branch is mispredicted, the execution pipeline is flushed behind the checkpointed instruction—for floating point instructions, this will typically mean flushing the entire execution pipeline, while for a mispredicted branch there may be a paired instruction in EX and two instructions in WB that would be allowed to complete.

For the exemplary microprocessor 10, the principle constraints on the degree of speculation are: (a) speculative execution is allowed for only up to four floating point or branch instructions at a time (i.e., the speculation level is maximum 4), and (b) a write or floating point store will not complete to the cache or external memory until the associated branch or floating point instruction has been resolved (i.e., the prediction is correct, or floating point instruction does not fault).

The unified cache 60 is a 4-way set associative (with a 4 k set size), using a pseudo-LRU replacement algorithm, with write-through and write-back modes. It is dual ported (through banking) to permit two memory accesses (data read, instruction fetch, or data write) per clock. The instruction line cache is a fully associative, lookaside implementation (relative to the unified cache), using an LRU replacement algorithm.

The FPU 70 includes a load/store stage with 4-deep load and store queues, a conversion stage (32-bit to 80-bit extended format), and an execution stage. Loads are controlled by the CPU core 20, and cacheable stores are directed through the write buffers 29 (i.e., a write buffer is allocated for each floating point store operation).

Referring to FIG. 1B, the microprocessor has seven-stage X and Y execution pipelines: instruction fetch IF), two instruction decode stages (ID1, ID2), two address calculation stages (AC1, AC2), execution (EX), and write-back (WB). Note that the complex ID and AC pipe stages are superpipelined.

The IF stage provides a continuous code stream into the CPU core 20. The prefetcher 35 fetches 16 bytes of instruction data into the prefetch buffer 30 from either the (primary) instruction line cache 65 or the (secondary) unified cache 60. BPU 40 is accessed with the prefetch address, and supplies target addresses to the prefetcher for predicted changes of flow, allowing the prefetcher to shift to a new code stream in one clock.

The decode stages ID1 and ID2 decode the variable length X86 instruction set. The instruction decoder 21 retrieves 16 bytes of instruction data from the prefetch buffer 30 each clock. In ID1, the length of two instructions is decoded (one each for the X and Y execution pipes) to obtain the X and Y instruction pointers—a corresponding X and Y bytes-used signal is sent back to the prefetch buffer (which then increments for the next 16 byte transfer) Also in ID1, certain instruction types are determined, such as changes of flow, and immediate and/or displacement operands are separated. The ID2 stage completes decoding the X and Y instructions, generating entry points for the microROM and decoding addressing modes and register fields.

During the ID stages, the optimum pipe for executing an instruction is determined, and the instruction is issued into that pipe. Pipe switching allows instructions to be switched from ID2X to AC1Y, and from ID2Y to AC1X. For the exemplary embodiment, certain instructions are issued only into the X pipeline: change of flow instructions, floating point instructions, and exclusive instructions. Exclusive instructions include: any instruction that may fault in the EX pipe stage and certain types of instructions such as protected mode segment loads, string instructions, special register access (control, debug, test), Multiply/Divide, Input/Output, Push All/Pop All (PUSH/POPA), and task switch. Exclusive instructions are able to use the resources of both pipes because they are issued alone from the ID stage (i.e., they are not paired with any other instruction). Except for these issue constraints, any instructions can be paired and issued into either the X or Y pipe.

The address calculation stages AC1 and AC2 calculate addresses for memory references and supply memory operands. The AC1 stage calculates two 32 bit linear (three operand) addresses per clock (four operand addresses, which are relatively infrequent, take two clocks). Data dependencies are also checked and resolved using the register translation unit 25a (register scoreboard and register renaming hardware)—the 32 physical registers 24 are used to map the 8 general purpose programmer visible logical registers defined in the X86 architecture (EAX, EBX, ECX, EDX, EDI, ESI, EBP, ESP).

The AC unit includes eight architectural (logical) registers (representing the X86 defined register set) that are used by the AC unit to avoid the delay required to access in AC1 the register translation unit before accessing register operands for address calculation. For instructions that require address calculations, AC1 waits until the required data in the architectural registers is valid (no read after write dependencies) before accessing those registers. During the AC2 stage, the register file 24 and the unified cache 60 are accessed with the physical address (for cache hits, cache access time for the dual ported unified cache is the same as that of a register, effectively extending the register set)—the physical address is either the linear address, or if address translation is enabled, a translated address generated by the ATU 50.

Translated addresses are generated by the ATU 50 from the linear address using information from page tables in memory and workspace control registers on chip. The unified cache is virtually indexed and physically tagged to permit, when address translation is enabled, set selection with the untranslated address (available at the end of AC1) and, for each set, tag comparison with the translated address from the ATU 50 (available early in AC2). Checks for any segmentation and/or address translation violations are also performed in AC2.

Instructions are kept in program order until it is determined that they will not cause an exception. For most instructions, this determination is made during or before AC2—floating point instructions and certain exclusive instructions may cause exceptions during execution. Instructions are passed in order from AC2 to EX (or in the case of floating point instructions, to the FPU)—because integer instructions that may still cause an exception in EX are designated exclusive, and therefore are issued alone into both execution pipes, handling exceptions in order is ensured.

The execution stages EXX and EXY perform the operations defined by the instruction. Instructions spend a variable number of clocks in EX, i.e., they are allowed to execute out of order (out of order completion). Both EX stages include adder, logical, and shifter functional units, and in addition, the EXX stage contains multiply/divide hardware.

The WB stage updates the register file 24, condition codes, and other parts of the machine state with the results of the previously executed instruction. The register file is written in Phase 1 (PH1) of WB and read in Phase 2 (PH2) of AC2.

1.2. System

Referring to FIG. 2 for the exemplary embodiment, microprocessor 10 is used in a processor system that includes a single chip memory and bus controller 82. The memory/bus controller 82 provides the interface between the microprocessor and the external memory subsystem—level two cache 84 and main memory 86—controlling data movement over the 64 bit processor data bus PD (the data path is external to the controller which reduces its pin count and cost).

Controller 82 interfaces directly to the 32-bit address bus PADDR, and includes a one bit wide data port (not shown) for reading and writing registers within the controller. A bi-directional isolation buffer 88 provides an address interface between microprocessor 10 and VL and ISA buses.

Controller 82 provides control for the VL and ISA bus interface. A VL/ISA interface chip 91 (such as an HT321) provides standard interfaces to a 32 bit VL bus and a 16 bit ISA bus. The ISA bus interfaces to BIOS 92, keyboard controller 93, and I/O chip 94, as well as standard ISA slots 95. The interface chip 91 interfaces to the 32 bit VL bus through a bi-directional 32/16 multiplexer 96 formed by dual high/low word [31:16]/[15:0] isolation buffers. The VL bus interfaces to standard VL slots 97, and through a bi-directional isolation buffer 98 to the low double word [31:0] of the 64 bit processor data (PD) bus.

2. Generalized Pipeline Architecture

Figure 3:
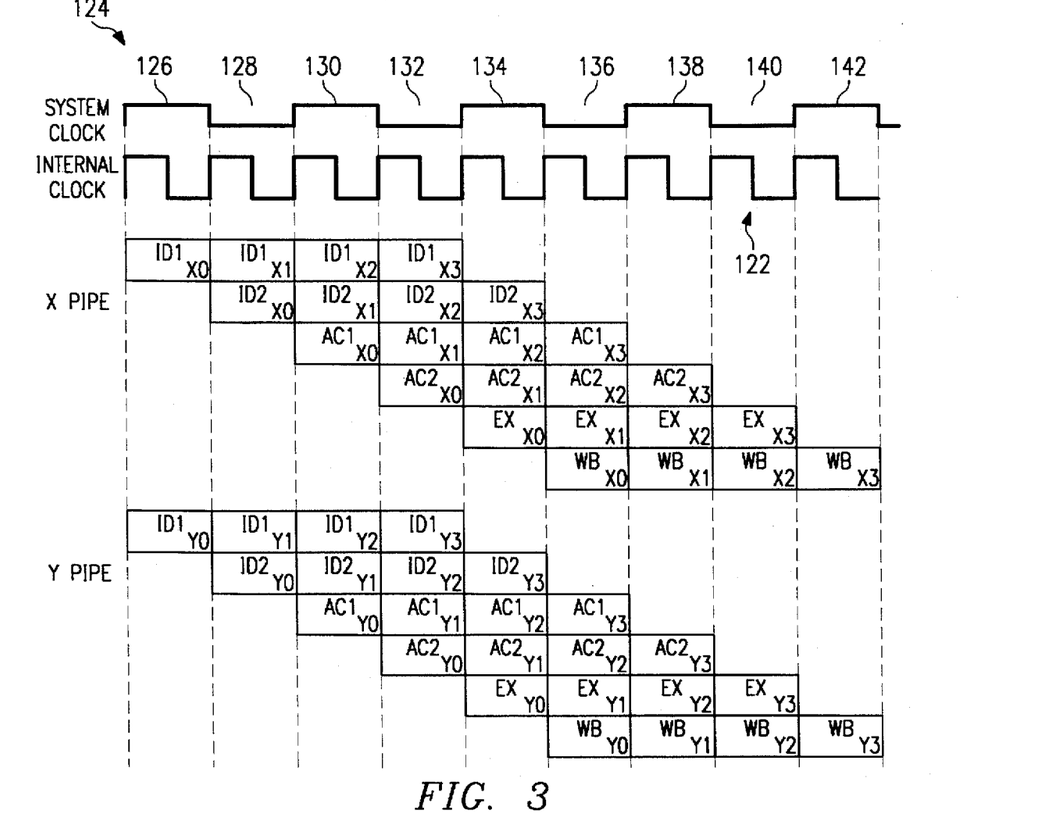
FIG. 3 illustrates a timing diagram showing the flow of instructions through the pipeline stages.

FIG. 3 illustrates the flow of four instructions per pipeline, showing the overlapping execution of the instructions, for a two pipeline architecture. Additional pipelines and additional stages for each pipeline could also be provided. In the preferred embodiment, the microprocessor 10 uses an internal clock 122 which is a multiple of the system clock 124. In FIG. 3, the internal clock is shown as operating at two times the frequency of the system clock. During the first internal clock cycle 126, the ID1 stage operates on respective instructions X0 and Y0. During internal clock cycle 128, instructions X0 and Y0 are in the ID2 stage (X0 being in ID2x and Y0 being in ID2y) and instructions X1 and Y1 are in the ID1 stage. During internal clock cycle 130, instructions X2 and Y2 are in the ID1 stage, instructions X1 and Y1 are in the ID2 stage (X1 being in ID2x and Y1 being in ID2y) and instructions X0 and Y0 are in the AC1 stage (X0 being in AC1x and Y0 being in AC1y). During internal clock cycle 132, instructions X3 and Y3 are in the ID1 stage, instructions X2 and Y2 are in the ID2 stage, instructions X1 and Y1 are in the AC1 stage and instructions X0 and Y0 are in the AC2 stage. The instructions continue to flow sequentially through the stages of the X and Y pipelines. As shown in clocks 134–140, the execution portion of each instruction is performed on sequential clock cycles. This is a major advantage of a pipelined architecture—the number of instructions completed per clock is increased, without reducing the execution time of an individual instruction. Consequently, a greater instruction throughput is achieved with greater demands on the speed of the hardware.

The instruction flow shown in FIG. 3 is the optimum case. As shown, each pipe stage completes on time and no stage requires more than one clock cycle. In an actual machine, however, one or more stages may require additional clock cycles to complete, thereby changing the flow of instructions through the other pipe stages. Furthermore, the flow of instructions through one pipeline may be dependent upon the flow of instructions through the other pipeline.

A number of factors may cause delays in various stages of one or all of the pipelines. For example, an access to memory may miss in the memory cache, thereby preventing access of the data in the time required to process the instruction in one clock. This would require that either, or both, sides of the AC1 stage to delay until the data was retrieved from main memory. For a particular stage, other stages of the pipeline may be using a needed resource, such as a multiplier, which is only in one of the execution stages in the illustrated embodiment. In this case, the stage must delay until the resource is available. Data dependencies can also cause delays. If an instruction needs the result from a previous instruction, such as an ADD, it must wait until that instruction is processed by the execution unit.

Other delays are caused by "multi-box" instructions; i.e., instructions which are implemented using multiple microinstructions, and therefore require more than one clock cycle to complete. These instructions stop the flow of subsequent instructions through the pipeline at the output of the ID2 stage.

The flow of instructions through the pipeline is controlled by the pipe control unit 28. In the preferred embodiment, a single pipe control unit 28 is used to control the flow of instructions through both (or all) of the pipes. To control the flow of instructions through the pipes, the pipe control until 28 receives "delay" signals from the various units comprising the pipelines 102 and 104, and issues "stall" signals to the various units.

Although a single pipe control unit 28 is used for both X and Y pipelines, the pipelines themselves are controlled independent of one another. In other words, a stall in the X pipeline does not necessarily cause a stall in the Y pipeline.

3. Input Buffer Circuit

Figure 4A:
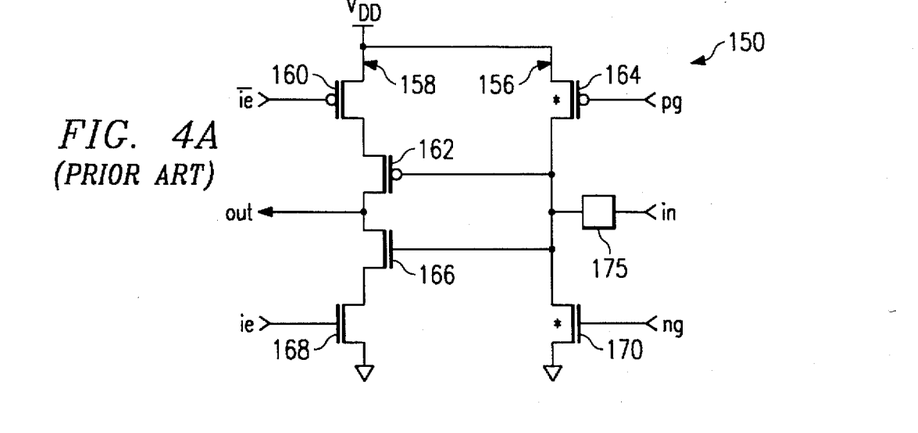
FIG. 4A illustrates a prior art input buffer circuit having programmable resistors incorporated therein.
Figure 4B:
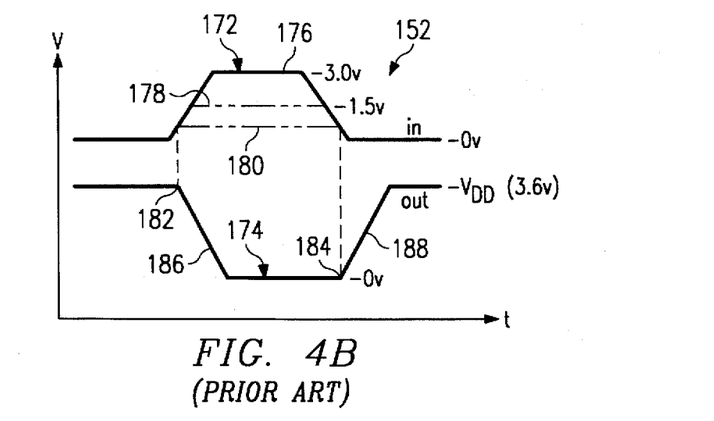
FIG. 4B illustrates a timing diagram showing the relationship between an external input signal and an output signal for the prior art input buffer circuit of FIG. 4A, wherein the input signal is pulled up.
Figure 4C:
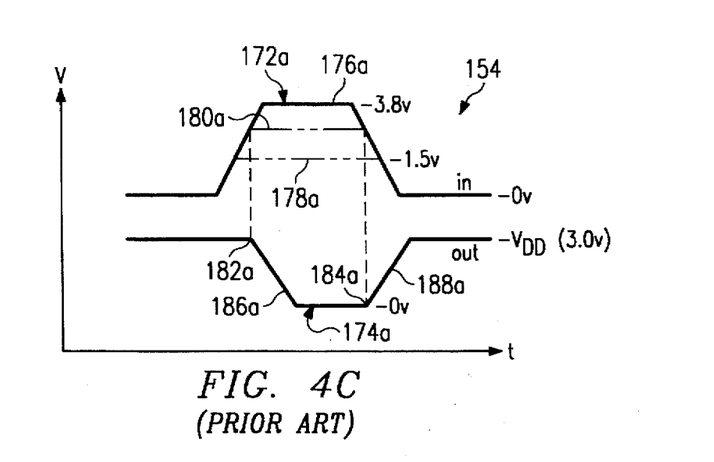
FIG. 4C illustrates a timing diagram showing the relationship between an external input signal and an output signal for the prior art input buffer circuit of FIG. 4A, wherein the input signal is pulled down.

Departing now from the description of the overall exemplary microprocessor 10, in FIGS. 4A–4C a prior art input buffer circuit 150 utilized to buffer inputs to prior art microprocessors, and exemplary timing diagrams 152 and 154 are illustrated. The input buffer circuit 150 comprises interconnected stacks, 156 and 158, of p-channel and n-channel transistors. The p-channel transistors, 160, 162, and 164, are representatively illustrated in an upper portion of the circuit 150, and the n-channel transistors, 166, 168, and 170, are representatively illustrated in a lower portion of the circuit. According to conventional practice, the p-channel and n-channel substrates are oppositely doped.

The p-channel transistors, 160, 162, and 164, are tied to the operating voltage (VDD) of the microprocessor 10. The n-channel transistors, 166, 168, and 170, are tied to ground. Thus, when transistors 160 and 162 are both on, the output is at voltage level VDD, and when transistors 166 and 168 are both on, the output signal is grounded. The output signal voltage, therefore, typically alternates between VDD and ground. This output signal voltage is coupled to a device, such as a CMOS device, on the microprocessor 10.

The ie and ie bar transistors, 168 and 160, are the input enable transistors which permit VDD and ground, respectively, to propagate to the output. When both of transistors 160 and 168 are on, that is, when ie is high and ie bar is low, input is enabled.

Gates 164 and 170 are implemented as weak transistors, also known to those skilled in the art as "programmable resistors". Therefore, when pg is low, causing transistor 164 to switch on, the input signal voltage is pulled up (see FIG. 4B), because the input signal is thereby tied to VDD through a resistor. Similarly, when ng is high, causing transistor 170 to switch on, the input signal voltage is pulled down somewhat (see FIG. 4C), since the input signal is thereby tied to ground through a resistor. Note that transistors 164 and 170 are not on simultaneously, they are alternately on (pg and ng being both high or both low) or simultaneously off (pg high and ng low).

In prior art microprocessors, the programmable resistors 164 and 170 were utilized to adapt the microprocessors to different environments. Signals pg and ng were selectively asserted or deasserted by software control, a configuration control register, hardware, such as reset strapping or bond wire, etc.

Referring specifically now to FIG. 4B, an exemplary timing diagram 152 is shown, the vertical axis indicating volts and the horizontal axis indicating time, wherein the input signal voltage has been pulled up by turning on transistor 164. Note that the illustrated input signal voltages, including switching voltages are external to the microprocessor 10, that is, they exist at a point where the microprocessor interfaces with the environment into which it is installed, such as at a pin extending outwardly from the microprocessor package whereby the microprocessor is connected to a circuit board. The illustrated input signal voltages do not include the effects of signal influencing factors, collectively represented as 175, between the pin and the input buffer circuit 150, such as resistance, capacitance, and inductance of conductors, electrostatic discharge circuits, etc.

In the illustrated example, rail voltage 176 of the input signal 172 is 3.0 volts and the VDD of the microprocessor 10 is 3.6 volts. The switching voltage 178 of the input signal 172 is 1.5 volts, corresponding to TTL specifications. When, however, transistor 164 is on and the input voltage is thereby pulled up, a lower "effective" switching voltage 180 of the input signal 172 causes transistor 166 to turn on at point 182 as the input signal voltage is rising, and causes transistor 162 to turn on at point 184 as the input signal voltage is falling. Therefore, in the prior art input buffer circuit 150, the leading edge 186 of the output signal 174 begins at point 182, earlier in time than when the switching voltage 178 of the input signal 172 is achieved, and the trailing edge 188 of the output signal begins at point 184, later in time than when the switching voltage of the input signal is reached.

Referring now specifically to FIG. 4C, an exemplary timing diagram 154 is shown, wherein the input signal voltage has been pulled down by turning on transistor 170. The same reference numerals are used in FIG. 4C as previously used to indicate similar portions of the input and output signals, with an added suffix "a" for purposes of clarity in the following description. In the illustrated example, rail voltage 176a of the input signal 172a is 3.8 volts and the VDD of the microprocessor 10 is 3.0 volts. The switching voltage 178a of the input signal 172a is 1.5 volts, corresponding to TTL specifications. When, however, transistor 170 is on and the input voltage is thereby pulled down, a higher "effective" switching voltage 180a of the input signal 172a causes transistor 166 to turn on at point 182a as the input signal voltage is rising, and causes transistor 162 to turn on at point 184a as the input signal voltage is falling. Therefore, in the prior art input buffer circuit 150, the leading edge 186a of the output signal 174a begins at point 182a, later in time than when the switching voltage 178a of the input signal 172a is achieved, and the trailing edge 188a of the output signal begins at point 184a, earlier in time than when the switching voltage of the input signal is reached.

It will be readily apparent to one of ordinary skill in the art that such advancements and delays in the leading and trailing edges of the output signals 174 and 174a are undesirable. Factors 175 between the input signal and the compensation circuit 150 may cause further changes in output signal timing. For a high degree of timing predictability necessary in current and future high speed microprocessors, such variations in output signal timing are unacceptable. The output signal timing should ideally be invariably and precisely associated with the switching voltage of the input signal, whether the input signal is pulled up, pulled down, or neither pulled up nor pulled down.

Figure 5A:
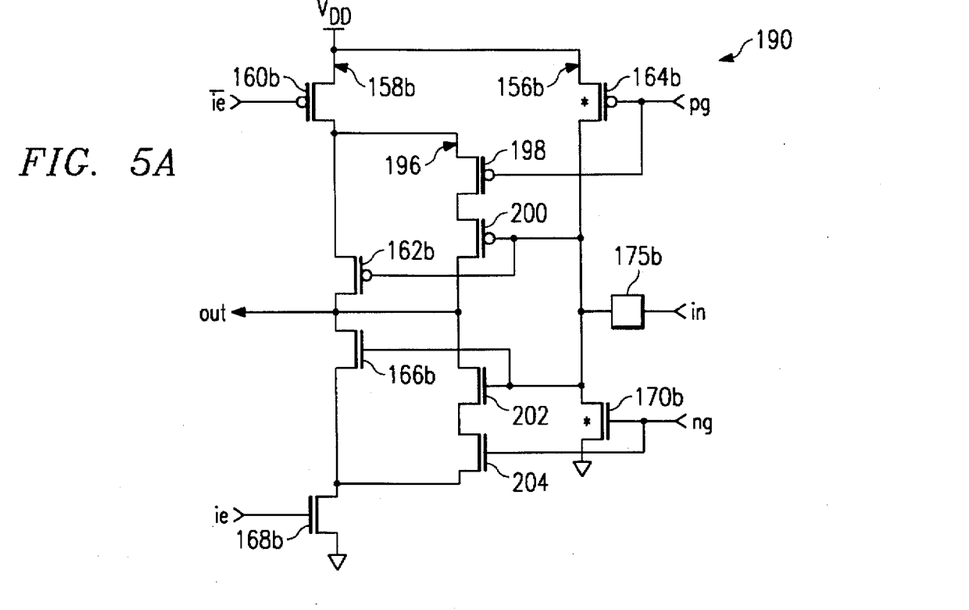
FIG. 5A illustrates an input buffer circuit embodying principles of the present invention.
Figure 5B:
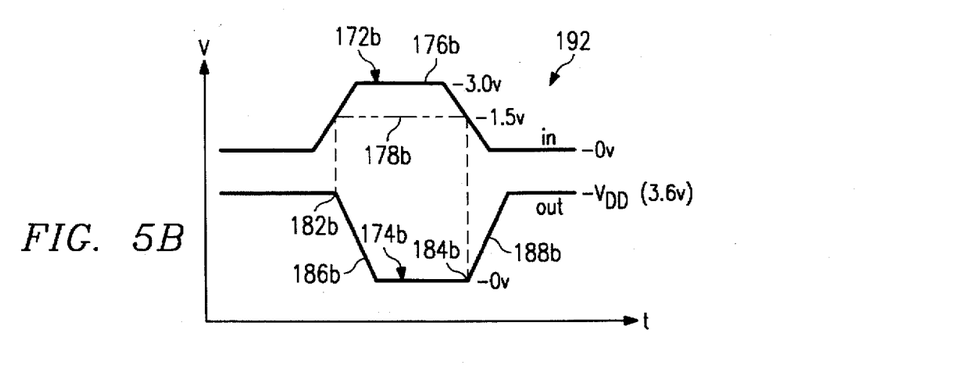
FIG. 5B illustrates a timing diagram for the input buffer circuit of FIG. 5A, wherein the input signal is pulled up.
Figure 5C:
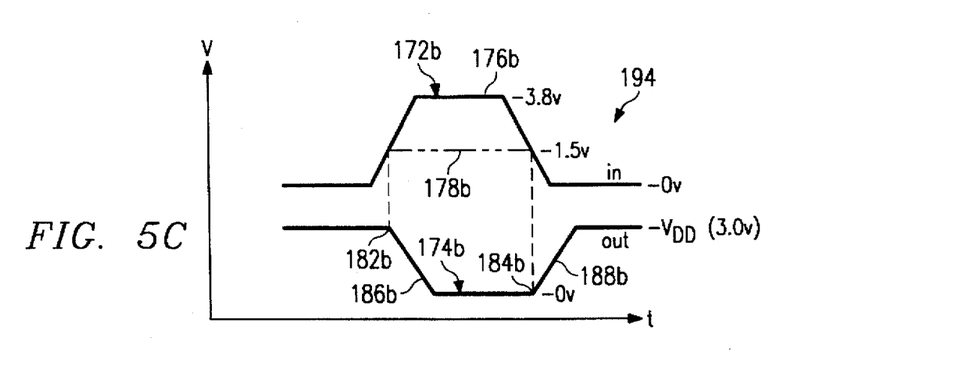
FIG. 5C illustrates a timing diagram for the input buffer circuit of FIG. 5A, wherein the input signal is pulled down.

Returning now to the detailed description of the exemplary microprocessor 10, in FIGS. 5A–5C are representatively illustrated a compensated input buffer circuit 190 and resulting timing diagrams thereof, 192 and 194, incorporating principles of the present invention. Elements of the circuit 190 and timing diagrams, 192 and 194, which function similarly to those previously described of the prior art circuit 150 and timing diagrams, 152 and 154, of FIGS. 4A–4C are indicated in FIGS. 5A–5C with the same reference numeral previously used, with an added suffix "b". It is to be understood that voltages shown in FIGS. 5B and 5C are exemplary and that other voltages may be utilized without departing from the principles of the present invention.

Referring specifically now to the compensated input buffer circuit 190 shown in FIG. 5A, stack 156b is tied to the pull up and pull down signals, pg and ng, respectively, and stack 158b is tied to the input enable signals, ie and ie bar, as before. Between stacks 156b and 158b, and tied to the input and output signals, is a compensation stack 196. Compensation stack 196 includes p-channel transistors 198 and 200, and n-channel transistors 202 and 204. Gate 198 enables the p-channel portion of the compensation stack 196 when pull up signal pg is low, and transistor 204 enables the n-channel portion of the compensation stack when pull down signal ng is high. According to conventional practice, the p-channel and n-channel substrates are oppositely doped.

Note that transistors 200 and 202 are both tied to the input signal. Transistor 200 connects VDD to the output when the input signal goes low and transistor 202 connects ground to the output when the input signal goes high. Note, also, that when neither transistor 164b nor transistor 170b are on, the compensation stack 196 is disabled, in which case the input voltage level is neither pulled up nor pulled down. The output is coupled to a device, such as a CMOS device, on the microprocessor 10.

Transistors 198–204 in the compensation stack 196 are dimensionally different from transistors 160b–168b of stack 158b. As will be readily appreciated by one skilled in the art, when the input signal is tied to the transistor, 200 or 202, which is on the portion of the compensation stack 196 enabled by the pull up or pull down signal, pg or ng, the physical difference in the transistor, 200 or 202, will cause the transistor to switch on or off at a different time than the corresponding p- or n-channel transistor 162b or 166b. Transistors 198–204 are, therefore, dimensioned so that the leading and trailing edges of the output signal correspond precisely in time with the switching voltage of the input signal.

Referring specifically now also to FIG. 5B, the timing diagram 192 is representatively illustrated, the vertical axis indicating volts and the horizontal axis indicating time, wherein the input signal 172b is pulled up, pg being low. The switching voltage 178b is at 1.5 v and the rail voltage 176b of the input signal 172b is at 3.0 volts. Since pg is low, transistor 198 is closed and transistor 204 is open, ng also being low. Thus, the p-channel portion of the compensation stack 196 is enabled.

For the particular characteristics of the microprocessor 10 and the environment into which the microprocessor will be installed transistor 200 is sized so that it will switch at an input signal voltage level that corresponds to the switching voltage 178b, and not at the "effective" switching voltage 180 (see FIG. 4B). For a transistor on a microprocessor, such as transistor 200 on microprocessor 10, the transistor's size is directly related to the input voltage level at which it switches. Point 182b thus occurs at the same point in time as switching voltage 178b is achieved at the leading edge of the input signal 172b, and point 184b occurs at the same point in time as the switching voltage 178b is reached at the trailing edge of the input signal 172b. Note that the leading and trailing edges, 186b and 188b respectively, of the output signal 174b correspond in time with the external switching voltage of the input signal 172b.

Referring specifically now also to FIG. 5C, the timing diagram 194 is representatively illustrated, wherein the input signal 172b is pulled down, ng being high. The switching voltage 178b is at 1.5 v and the rail voltage 176b of the input signal 172b is at 3.8 volts. Since ng is high, transistor 204 is closed and transistor 198 is open, pg also being high. Thus, the n-channel portion of the compensation stack 196 is enabled.

For the particular characteristics of the microprocessor 10 and the environment into which the microprocessor will be installed, transistor 202 is sized so that it will switch at an input signal voltage level that corresponds to the switching voltage 178b, and not at the "effective" switching voltage 180a (see FIG. 4C). Point 182b thus occurs at the same point in time as switching voltage 178b is achieved at the leading edge of the input signal 172b, and point 184b occurs at the same point in time as the switching voltage 178b is reached at the trailing edge of the input signal 172b. Note that the leading and trailing edges, 186b and 188b respectively, of the output signal 174b correspond in time with the external switching voltage of the input signal 172b, the same as described above for the circumstance in which the input signal was pulled up (i.e., as shown in FIG. 5B). Appropriately sized, the compensation stack 196 also compensates for factors 175b, which are known for a particular microprocessor package.

Thus has been described the compensated input buffer circuit 190 which compensates for timing effects caused by the programmable pull up resistor 164b, by the programmable pull down resistor 170b, and by the factors 175b. Use of the circuit 190 permits economical mass production of high speed microprocessors 10 which may be utilized in environments requiring the input signal 172b to be pulled up, pulled down, or neither pulled up nor pulled down.

Figure 6:
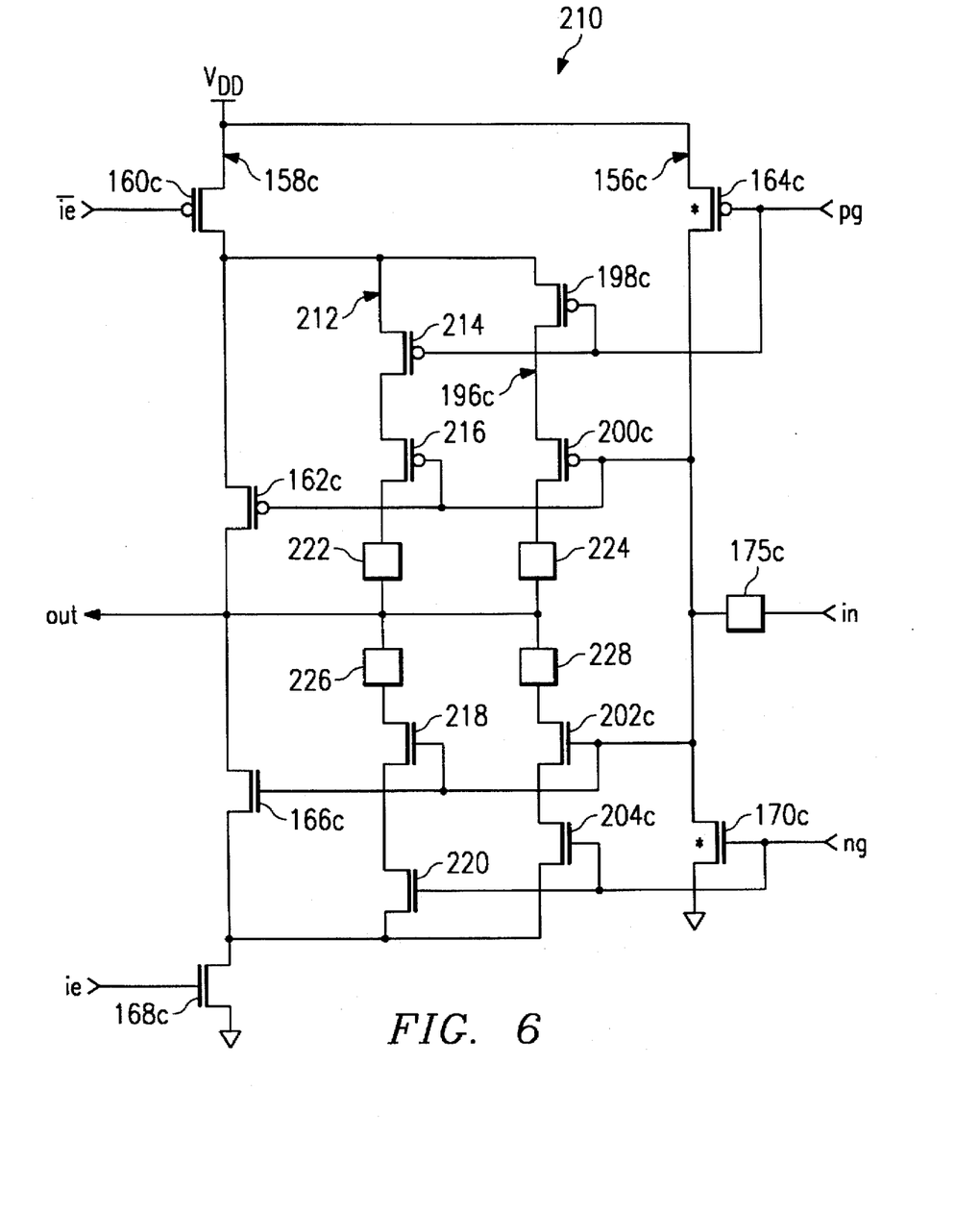
FIG. 6 illustrates another input buffer circuit embodying principles of the present invention.

Referring now additionally to FIG. 6, a compensated input buffer circuit 210 incorporating principles of the present invention is representatively illustrated. Elements of the circuit 210 which function similarly to those previously described are indicated in FIG. 6 with the same reference numeral previously used, with an added suffix "c".

Referring specifically now to the compensated input buffer circuit 210 shown in FIG. 6, stack 156c is tied to the pull up and pull down signals, pg and ng, respectively, stack 158c is tied to the input enable signals, ie and ie bar, and stack 196c is tied to the input, pull up, and pull down signals, in, pg, and ng, respectively, as before. Between stacks 158c and 196c, and tied to the input, pull up, and pull down signals, is another compensation stack 212. Compensation stack 212 includes p-channel transistors 214 and 216, and n-channel transistors 218 and 220.

Connections 222, 224, 226 and 228 determine which of the p-channel or n-channel portions of compensation stacks 212 and 196c are connected to the output. Connections 222, 224, 226, and 228 may be selected by, for example, applying a trace of metal between the appropriate p-channel or n-channel portions of the compensation stacks 196c and 212, software control of switches, or any other method of connecting the selected portions of the compensation stacks to the output, during or after the microprocessor's manufacture. Preferably, in mass production of the microprocessor 10 for use in a specific environment, selected ones of connections 222–228 are made during the microprocessor's manufacture by selectively applying a trace of metal between the desired p- or n-channel portion of the compensation stack 212 or 196c. In the preferred embodiment, the trace of metal is disposed on the top, or high, level. It is to be understood that any combination of connections 222–228 may connect any corresponding combination of p- or n-channel portions of the compensation stacks 212 and 196c, as needed to compensate for a particular microprocessor package/VDD, factors 175c, pull up or pull down resistors, etc.

For the particular characteristics of the microprocessor 10 and the environments into which the microprocessor may be installed, transistors 198c–204c and 214–220 are sized so that they will switch at an external input signal voltage level that corresponds to the switching voltage 178b (see FIGS. 5B and 5C). The leading and trailing edges of the output signal thus correspond in time with the external switching voltage of the input signal. Appropriately sized, selected portions of the compensation stacks 196c and 212 also compensate for factors 175c, which are known for a particular microprocessor package.

Thus has been described the compensated input buffer circuit 210 which compensates for timing effects caused by the programmable pull up resistor 164c, by the programmable pull down resistor 170c, and by the factors 175c, and which provides selectable combinations of p- and n-channel portions of multiple compensation stacks 196c and 212, permitting the microprocessor 10 to be utilized in a wide variety of environments. Use of the circuit 210 permits economical mass production of high speed microprocessors 10 which may be utilized in various environments, which may operate at various VDD voltage levels, and which may be packaged in a variety of manners affecting the input signal.

The foregoing detailed description is to be clearly understood as being given by way of illustration and example only, the spirit and scope of the present invention being limited solely by the appended claims.

What is claimed is:

1. A method of buffering an input signal to a processor incorporating a device having an operating voltage, the method comprising the steps of:

providing an output to the processor;

providing a first programmable resistor having an input;

coupling said first programmable resistor intermediate the input signal and the device operating voltage;

providing a first transistor having an input;

coupling said first transistor intermediate the device operating voltage and said output;

coupling said first transistor input to the input signal;

providing a second transistor having an input;

coupling said second transistor intermediate the device operating voltage and said first transistor;

coupling said second transistor input to said first programmable resistor input;

providing a third transistor having an input;

coupling said third transistor intermediate the device operating voltage and said output; and coupling said third transistor input to the input signal,
whereby said first and second transistors are coupled in series with respect to each other, and in parallel with respect to said third transistor, intermediate the device operating voltage and said output, and
wherein said second transistor is on when said programmable resistor is on, and said first and third transistors are switchable in response to the input signal.

2. A method of buffering a signal input to a microprocessor, the signal having a rail voltage and a switch point, and the microprocessor incorporating a device, an operating voltage source for the device, and a ground, the method comprising the steps of:

providing a plurality of p-channel transistors, each of said p-channel transistors having an input, and a first one of said p-channel transistors being implemented as a first programmable resistor;

coupling second and third ones of said p-channel transistors in series intermediate the device operating voltage source and the device;

coupling said second p-channel transistor input to the signal;

coupling said third p-channel transistor input to said first programmable resistor input;

coupling a fourth one of said p-channel transistors intermediate the device operating voltage source and the device in parallel with said second and third p-channel transistors;

coupling said fourth p-channel transistor input to the signal; and coupling a fifth one of said p-channel transistors in series intermediate the device operating voltage and said second, third, and fourth p-channel transistors,
wherein said fourth p-channel transistor and said series coupled second and third p-channel transistors provide alternate paths for coupling the operating voltage source to the device.

3. An input buffer circuit, comprising:

an input signal line, said input signal line being capable of conducting an input signal;

an output signal line, said output signal line being capable of conducting an output signal;

a voltage source line, said voltage source line being capable of coupling to a voltage source;

a first weak transistor having an input, said first weak transistor being coupled intermediate said voltage source line and said input signal line;

first and second transistors connected in series, one of said first and second transistors being connected to said output signal line, each of said first and second transistors having an input and a size, said first transistor input being coupled to said input signal line, and said second transistor input being coupled to said first weak transistor input;

a third transistor connected in series with said first and second transistors intermediate said voltage source line and the other one of said first and second transistors; and a fourth transistor connected in parallel with said first and second transistors intermediate said third transistor and said output signal line, said fourth transistor having an input coupled to said input signal line, wherein said first and fourth transistors are switchable in response to said input signal and said second transistor is switchable in response to a signal on said first weak transistor input.

4. A processor for use within a computing system having an input signal line capable of conducting an input signal, a ground line coupled to a ground, and a voltage source line coupled to a voltage source, the processor comprising:

an output signal line;

a first weak transistor having an input, said first weak transistor being coupled intermediate the voltage source line and the input signal line;

first and second transistors connected in series, each of said first and second transistors having an input and a size, said first transistor input being coupled to the input signal line, said second transistor input being coupled to said first weak transistor input, and one of said first and second transistors being coupled to the ground line;

a third transistor connected in series with said first and second transistors intermediate the voltage source line and the other of said first and second transistors; and a fourth transistor connected in parallel with said first and second transistors intermediate said third transistor and said output signal line, said fourth transistor having an input coupled to the input signal line, wherein said output signal line is coupled to the voltage source line when said third transistor is switched on and said fourth transistor is switched on, and when said third transistor is switched on and both of said second and third transistors are switched on.

5. A computing system, comprising:

an operating voltage source;

a first device capable of transmitting a signal on an input line;

a ground; and a processor, said processor having a second device and an input buffer circuit coupled to said second device, said second device being coupled to said operating voltage source, said input buffer circuit being coupled to said input line and including an output line coupled to said second device, a first programmable resistor having an input, said first programmable resistor being coupled intermediate said input line and said operating voltage source, a first transistor having an input, said first transistor being coupled intermediate said operating voltage source and said output line, said first transistor input being coupled to said input line, a second transistor having an input, said second transistor being coupled intermediate said operating voltage source and said first transistor, said second transistor input being coupled to said first programmable resistor input, a third transistor having an input, said third transistor being coupled intermediate said operating voltage source and said output line, and said third transistor input being coupled to said input line.

* * * * *